United States Patent [19]

Karcher

[11] 4,346,817
[45] Aug. 31, 1982

[54] MATERIAL HANDLING APPARATUS

[75] Inventor: DeWayne E. Karcher, Glendale, Ariz.

[73] Assignee: Honeywell Information Systems Inc., Phoenix, Ariz.

[21] Appl. No.: 153,367

[22] Filed: May 27, 1980

Related U.S. Application Data

[63] Continuation-in-part of Ser. No. 37,187, May 8, 1979, abandoned.

[51] Int. Cl.³ .............................................. B65G 1/08
[52] U.S. Cl. .................................... 221/312 R; 312/60
[58] Field of Search .............. 221/312 A, 312 B, 198, 221/197, 310, 279, 232, 287; 312/60, 61, 50, 71, 193, 184, 189; 353/19; 220/345; 206/505–507, 39.5

[56] References Cited

U.S. PATENT DOCUMENTS 3,410,455 11/1968 Haas ..................................... 221/229
3,412,897 11/1968 Slater ................................ 221/310 X
4,043,485 8/1977 Tippetts ............................. 312/60 X

FOREIGN PATENT DOCUMENTS 461959 11/1913 France ................................ 312/189

Primary Examiner—Stanley H. Tollberg
Attorney, Agent, or Firm—Edward W. Hughes; W. W. Holloway, Jr.; N. Prasinos

[57] ABSTRACT

Material handling apparatus in which a rectangular laminar fixture for a segment of film is provided with asymmetrically positioned recesses. The fixtures are adapted to be loaded into, stored in, and removed from a magazine provided with projections around which the recesses of the fixture stored in the magazine slidably fit. Only fixtures having the correct orientation with respect to the magazine can be stored within the magazine. The recesses of the fixtures and the projections of the magazine prevent a fixture stored in the magazine from changing its orientation.

9 Claims, 15 Drawing Figures

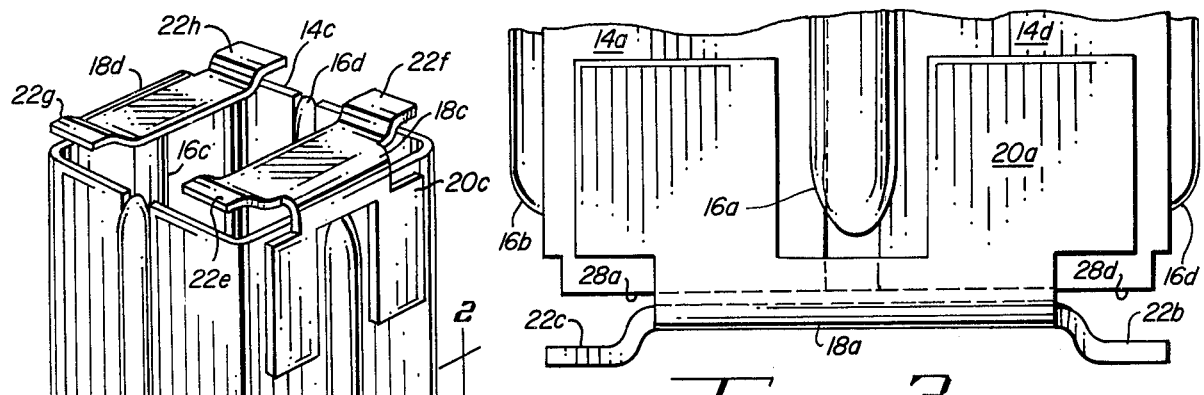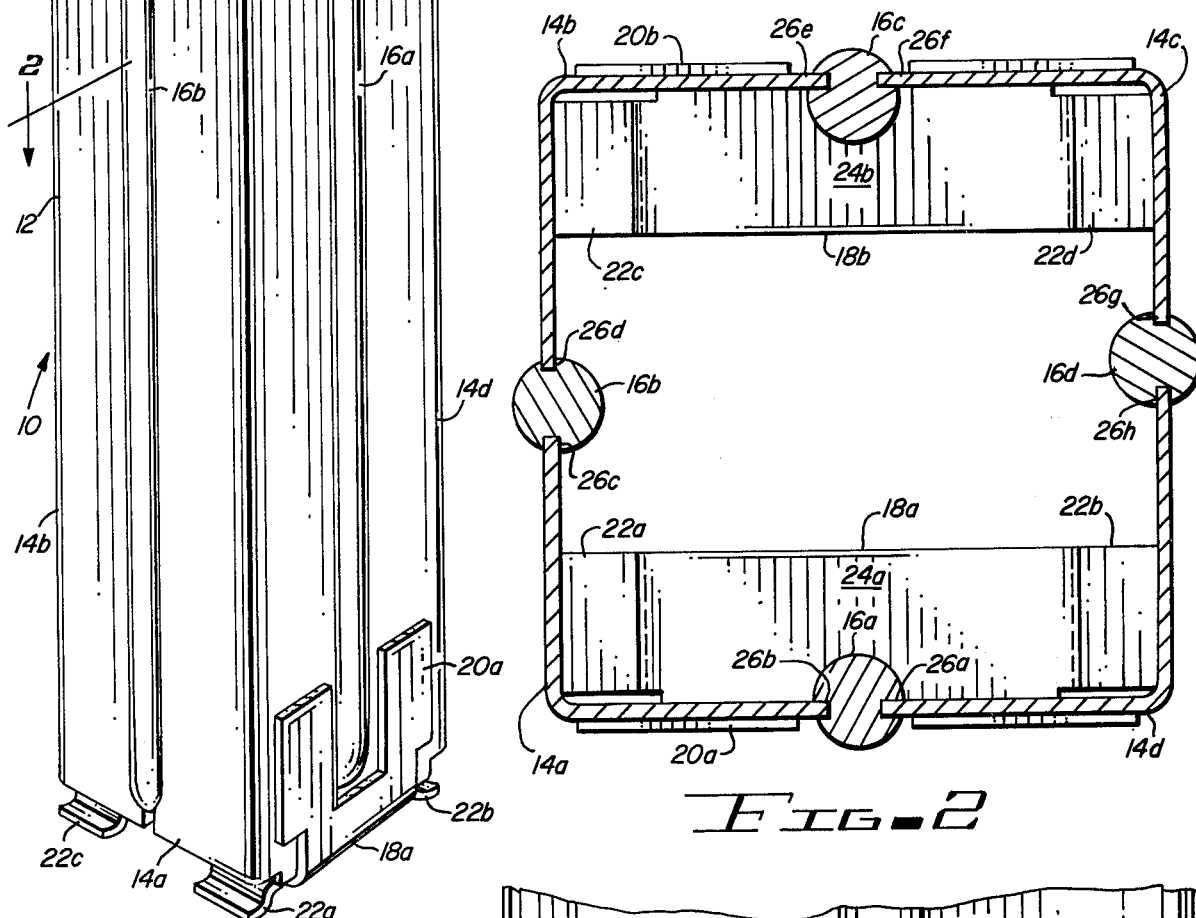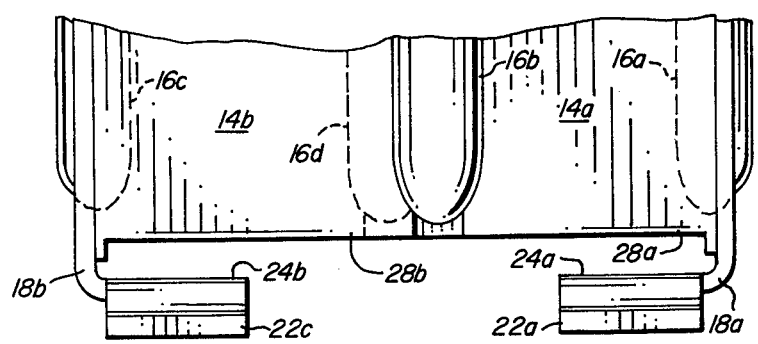

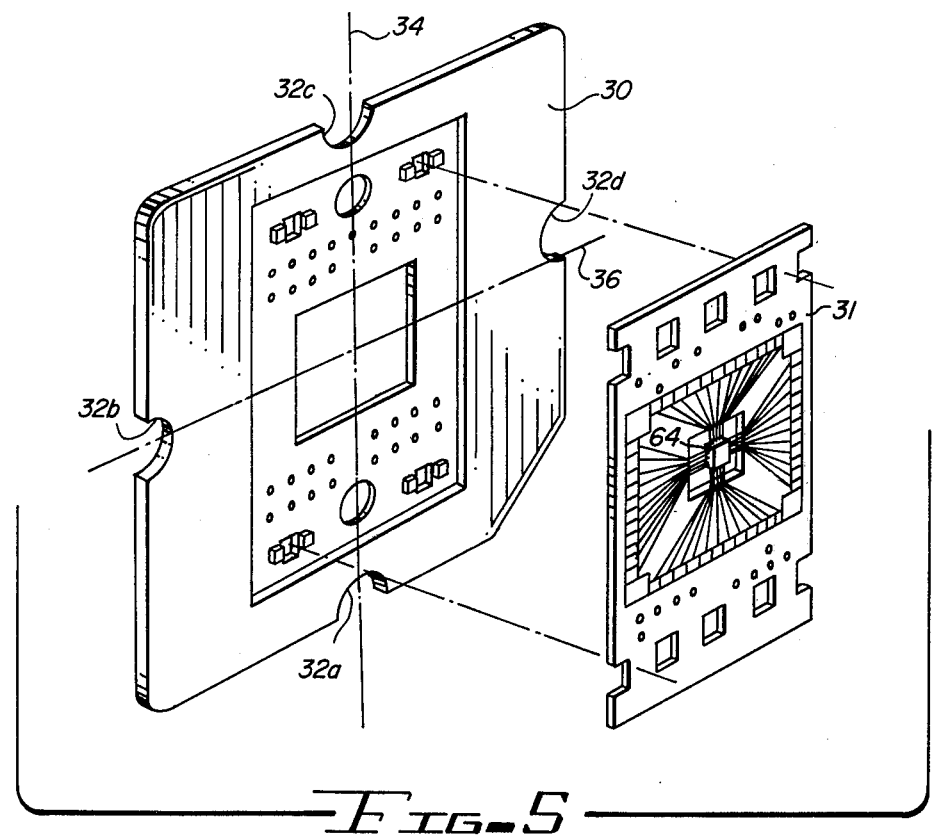

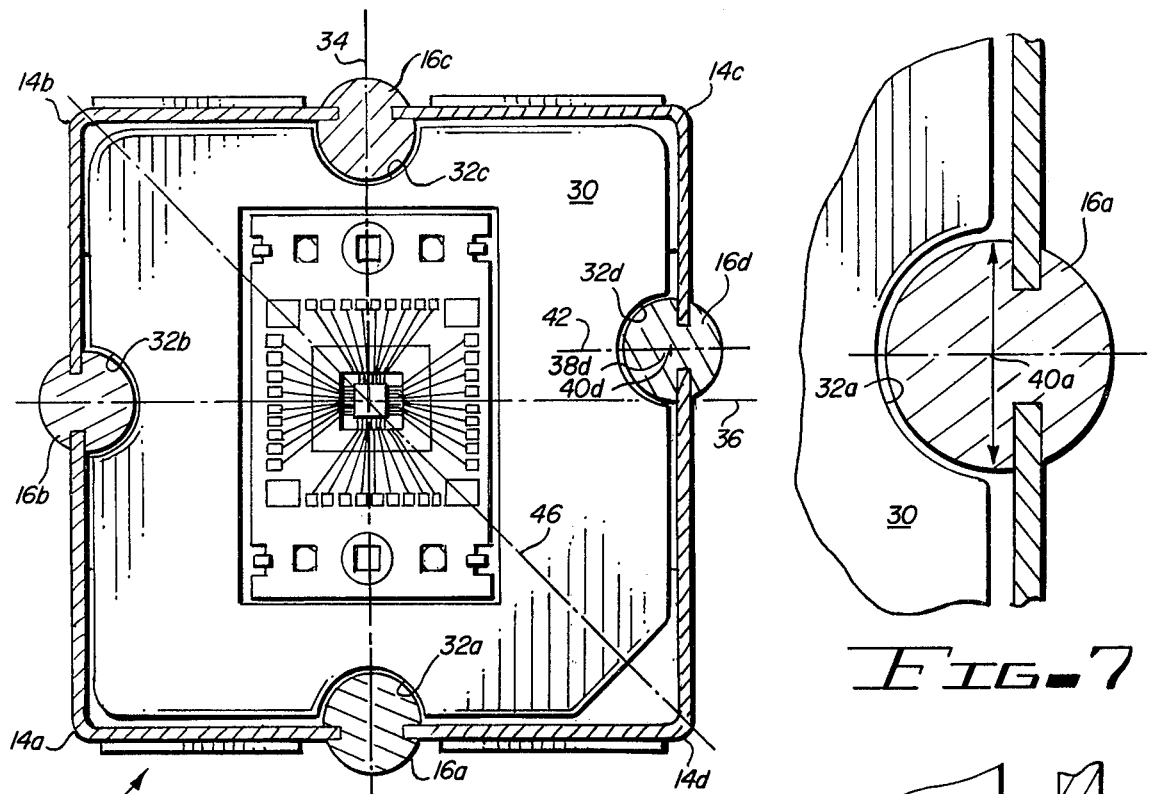
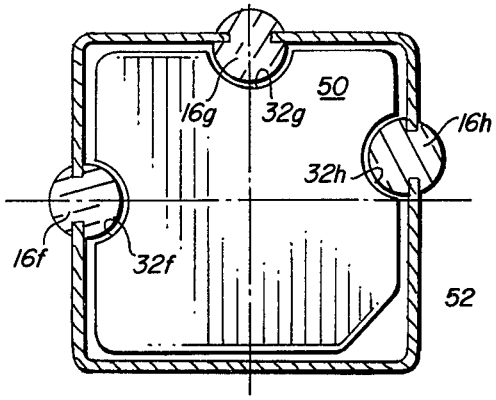
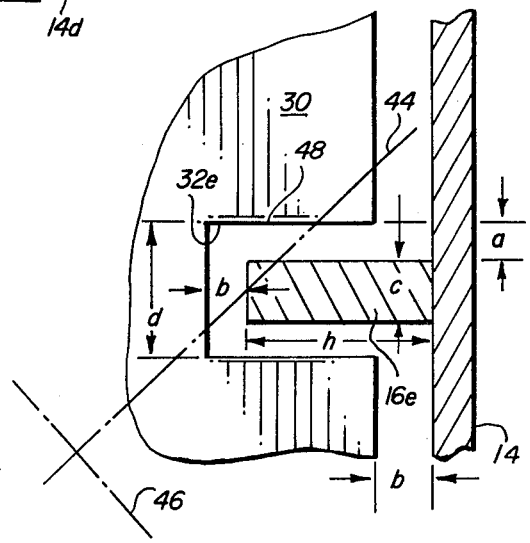

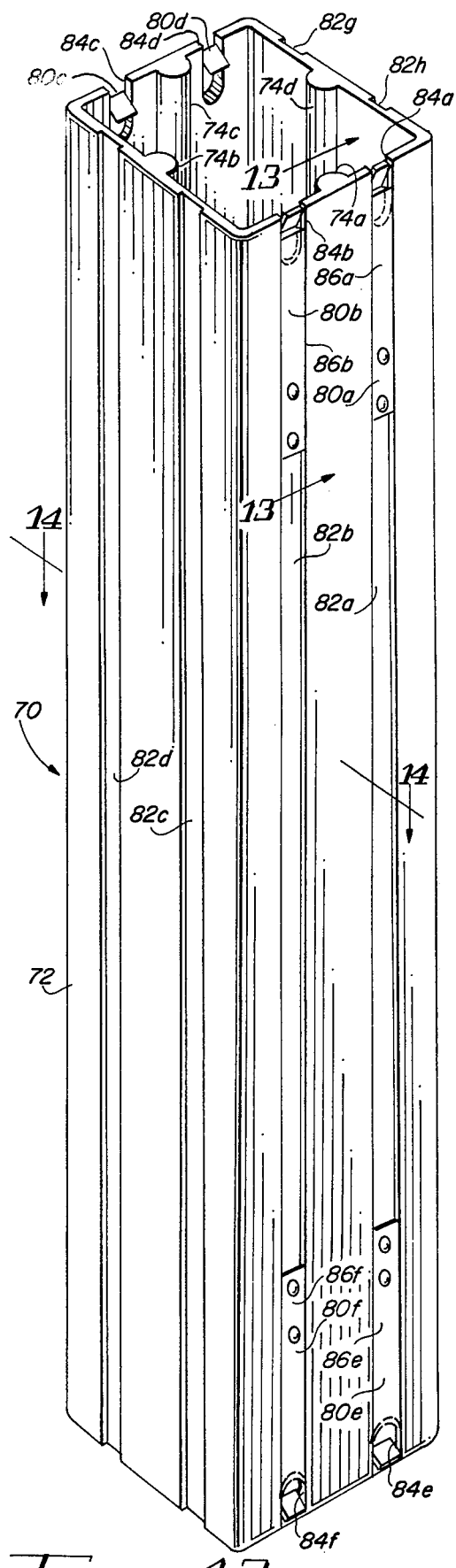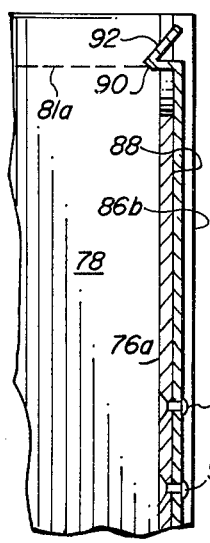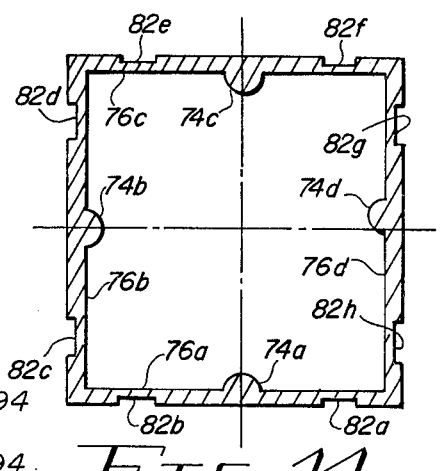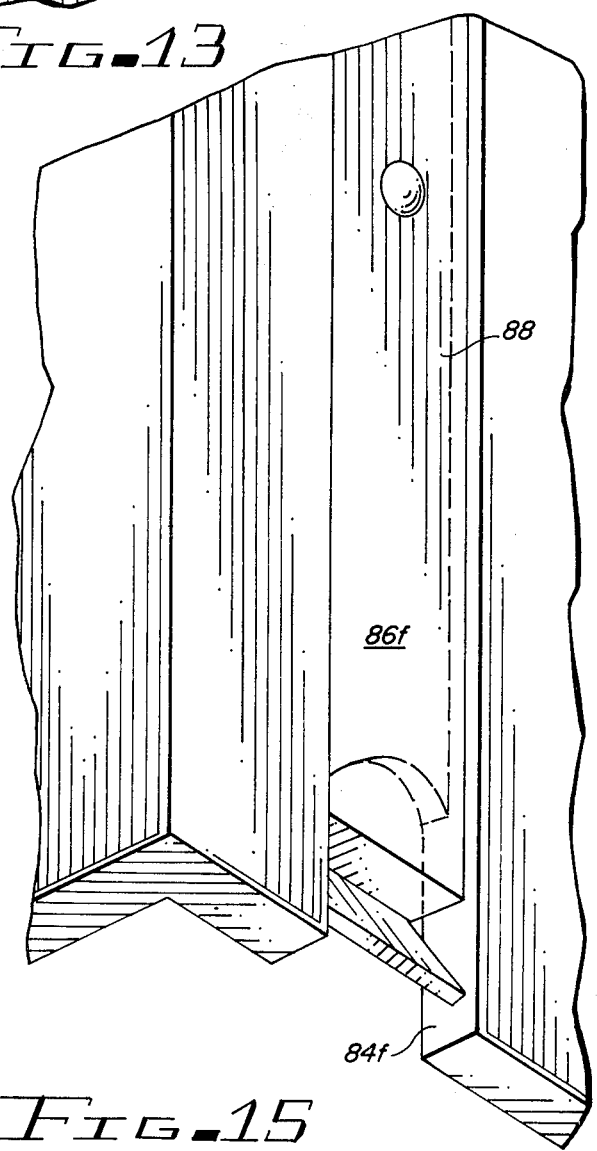

MATERIAL HANDLING APPARATUS

CROSS-REFERENCE TO RELATED APPLICATION

This invention is a continuation-in-part of Application Ser. No. 37,187 filed May 8, 1979 now abandoned for Material Handling Apparatus.

BACKGROUND OF THE INVENTION

1. Field of the Invention

This invention is in the field of material handling apparatus. The materials handled are segments of film strips, which segments may have attached to them integrated circuit (IC) chips with an IC chip being bonded to a flexible beam lead frame formed on each segment. The handling apparatus consists of rectangular laminar fixtures each with the capability of having one segment removably mounted on it and at least one magazine for such fixtures. The fixtures and magazines are provided with asymmetrically positioned recesses and protrusions so that only a fixture having a predetermined orientation can be stored in a magazine. Once a fixture is stored in a magazine the co-operating protrusions and recesses prevent fixtures in the magazine from changing their orientation relative to the magazine irrespective of the orientation or manner of handling of the magazine.

2. Description of the Prior Art

The development of integrated circuit (IC) chips particularly medium and large scale IC chips has created a need for improved manufacturing processes which lend themselves to automating the connecting of conductive flexible leads of a lead frame to an IC chip and of such chips and a part of their lead frames to substrates or into packages so that the IC chips can be connected into useful electronic circuits. In implementing such provisions, fixtures such as those described and illustrated in U.S. Pat. No. 4,069,496 which issued on Jan. 17, 1978 can be used to removably hold a segment of a film strip on which such an IC chip has been bonded to a lead frame which frame is in turn attached to the segment.

In automating the process of manufacturing hybrid substrates, it is desirable to assemble, or collect, a plurality of fixtures into a magazine such as that described and illustrated in U.S. Pat. No. 4,043,485 which issued on Aug. 23, 1977. Each of the fixtures stored in a magazine may have an IC chip bonded to the segment of film held by each fixture. Each such magazine has the capability of having such fixtures inserted into the magazine by a machine and subsequently removed by a machine as steps in the process of manufacturing electrical circuits. Such circuits are characterized by having a high density of active electrical elements per unit area of the substrate on which the IC chips are mounted. As a result, such substrates are particularly suitable for use in computers and electronic devices of like complexity.

One problem with the prior art fixtures is that if the polarity keys of a stack of such fixtures are aligned, there are two possible orientations of the fixtures in the stack; one in which the surface of the chip to which the lead frame is bonded is up and the other in which that surface is down.

Another problem with the prior art fixtures and magazines is that the fixtures stored in a magazine can have their orientation with respect to the magazine changed if the magazine is placed in a horizontal or inverted position either accidentally or deliberately, particularly if the magazine is not full, when it is laid, or falls down. As a result, some of the fixtures stored, or stacked, in a magazine which had the same initial orientation with respect to the magazine, may be inverted without anyone becoming aware that this has occurred. In any automated process it is obviously important that the possibility, or opportunity, for deviation from the desired arrangement, or orientation of the fixtures stored in a magazine be eliminated to make the manufacturing process more reliable and cost effective.

SUMMARY OF THE INVENTION

The present invention provides material handling apparatus, substantially rectangular laminar fixtures with each fixture being adapted to have a segment of film secured to it and at least one magazine adapted to have such fixtures machine loaded into the magazine and unloaded from the magazine from either end of the magazine. The sides of the fixtures are provided with a plurality of asymmetrically located recesses. The magazine is provided with a plurality of protrusions around which the recesses of the fixtures slidably fit. As a result, fixtures having only one orientation with respect to the magazine can be loaded and stored into the magazine and once stored in such a magazine the fixtures are constrained by the interaction of their recesses with the protrusions of the magazine to the same orientation with respect to magazine irrespective of changes in the orientation of the magazine.

It is therefore an object of this invention to provide an improved material handling apparatus in which rectangular and planar fixtures having only one orientation may be stored in a magazine.

It is another object of this invention to provide improved material handling apparatus in which fixtures having only one orientation may be loaded and stored into a magazine and which fixtures when stored in the magazine are mechanically inhibited from changing their orientation while stored therein.

It is yet another object of this invention to provide improved material handling apparatus in which substantially square laminar fixtures having a predetermined orientation with respect to a magazine can be machine loaded into the magazine from either end and can be machine unloaded from a magazine from either end, and which fixtures while stored in the magazine are prevented from changing their orientation with respect to the magazine.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure and in which:

FIG. 1 is an isometric view of one embodiment of the magazine of the invention.

FIG. 2 is a section, at an enlarged scale, taken on line 2—2 of FIG. 1 when the magazine is empty.

FIG. 3 is an enlarged fragmentary side elevation of one of the two bases of the improved magazine.

FIG. 4 is an enlarged fragmentary front elevation of one of the two bases of the improved magazine.

FIG. 5 is an isometric view of the improved reusable slide mount with a segment of film strip exploded therefrom.

FIG. 6 is a section similar to that of FIG. 2 with a reusable slide mount stored in a magazine.

FIG. 7 is an enlarged fragmentary view showing the relationship between a recess in a mount and a cooperating protrusion of a magazine.

FIG. 8 is an enlarged diagramatic view illustrating the relationships between the dimensions of the recess in holder and protrusions of the magazine which must be satisfied to prevent a mount from changing orientation once it is stored in a magazine.

FIG. 9 is a cross sectional view similar to FIG. 6 but on a reduced scale showing a second embodiment of the invention.

FIG. 10 is a view similar to FIG. 9 of another embodiment of the invention.

FIG. 11 is an enlarged fragmentary view illustrating another embodiment of a recess on a mount and the co-operating projection of a magazine to prevent a stored mount from substantially changing its orientation with respect to a magazine.

FIG. 12 is an isometric view of another embodiment of the magazine of the invention.

FIG. 13 is an enlarged fragmentary section taken on line 13—13 of FIG. 12.

FIG. 14 is a section taken on line 14—14 of FIG. 12.

FIG. 15 is a fragmentary perspective at an enlarged scale showing details of a spring catch of the magazine of FIG. 12.

DESCRIPTION OF THE PREFERRED EMBODIMENT

Referring to FIG. 1, magazine 10 includes a hollow substantially rectangular tube 12. Tube 12 is formed from four angles 14a–d which are made from sheet material such as sheet steel. The angles 14 are joined together by rods, projections, or protrusions 16a–d to form the tube. Attached to the bottom of tube 12, as illustrated in FIGS. 1 and 2 is a pair of legs 18a,b which form one base of magazine 10. A substantially identical pair of legs 18c,d is attached to the top of tube 12 and form a second base of magazine 10. Each of the legs 18a–d is provided with a flange 20a–d, a pair of feet 22a–h and a rail 24a–d. Details of the legs 18a–d are best illustrated in FIGS. 2, 3 and 4.

In the embodiment of magazine 10 illustrated in FIGS. 1-6 each of the rods 16a–d has substantially a constant circular cross section and is provided with a pair of grooves 26a–h into each of which an edge or a side of one of the angles 14a–d fits. The grooves 26a–h can be milled into rods 16a–d for example. Angles 14 and rods 16 are preferably made of an appropriate sheet metal, such as steel. As is best illustrated in FIGS. 3 and 4, the distance between the top surface, for example, of rails 24a, b of legs 18a, b from the bottom edge 28a, b of angles 14a, 14b is greater than the thickness of a fixture 30, one of which is illustrated in FIG. 5, but less than twice the thickness of a fixture, or slide mount, 30.

As pointed out above, magazine 10 is provided with one pair of legs 18a, 18b at one end of tube 12 and another pair 18c, 18d at the other end of tube 12. The function of the pairs of legs 18 are twofold. One function is to provide means for mounting a magazine 10 on a sequencer such as is illustrated in U.S. Pat. No. 4,053,065 which issued on Oct. 11, 1977 or on a placement machine such as is illustrated in U.S. Pat. No. 4,079,489 which issued on Mar. 21, 1978. A second function is to close off, or block, the ends of tube 12 so that fixtures 30 stored in a tube 12 can only be removed one at a time through the gap between the edges of angles 28a–h and the nearest surfaces of rails 24a–d. Fixtures 30 thus can be stacked vertically within a magazine 30 from either end of tube 12 and can be removed from either end, one at a time, or sequentially, as is described in U.S. Pat. No. 4,043,485, which issued on Aug. 23, 1977.

The ability to both load and unload magazines 10 from either end has certain advantages. Apparatus for testing an I.C. chip mounted on a lead frame formed on a segment of film 31 frequently requires that the portion of the chip bonded to the lead frame be oriented downwardly. Other operations, particularly manufacturing operations, generally require that the portion of the chip bonded to the lead frame be oriented upwardly.

Providing magazine 10 with bases at each end so that it can be mounted on testing and manufacturing apparatus with the fixtures 30 and I.C. chips mounted on such fixtures stored in the magazine 10 will have the proper orientation required for each such apparatus, avoids the necessity of modifying or redesigning some of the apparatus used so that all such apparatus require the chips to have the same orientation or of providing additional mechanical devices between a magazine 10 and the using apparatus which will properly orient holders 30 to meet the requirements for a given apparatus and then to reorient the holders back to their initial orientation prior to the holders being stored back into another magazine 10.

Mount 30 differs from the resuable fixture or slide mount for integrated circuit chips illustrated and claimed in U.S. Pat. No. 4,069,496 by being provided with recesses, or notches, 32a–d. In the embodiment illustrated in FIG. 5 the notches, or recesses, 32a–d each have a cross section of a semicircle substantially lying on the outer edges of the substantially rectangular, preferably square, shaped mount 30. In the embodiment illustrated in FIG. 5, the center of recesses 32a, b, and c substantially lie on perpendicular bisectors 34 or 36 of the sides of mount 40. Recess 32d has its center displaced from the perpendicular bisector 36 a distance substantially equal to the radius of recess 32d.

Referring to FIG. 6, a fixture, or slide frame 30, is illustrated as being stored in magazine 10. Fixture 30 is positioned so that its recesses 32a–d slidably fit around the protrusions or projection 16a–d of magazine 10. Because recesses 32d and co-operating projection 16d are asymmetrically positioned; i.e., their centers 38d, 40d do not lie on either of the perpendicular bisectors 34, 36 there is only one possible orientation that fixture 20 can have with respect to magazine 10 within which it is stored. The centers 38d, 40d of recess 32d and projection 16d substantially coincide when the walls of fixture 30 are spaced substantially equally distant from the inner walls of angles 14a–d and lie on line 42 which is parallel to perpendicular bisector 36 but is displaced to one side a distance substantially equal to the radius of recess 32d. The diameters of rods 16a–d are chosen in the preferred embodiment to be slightly less than the diameter of the recessed 32a–d to provide appropriate clearance between the rods 16 and the recesses 32. Such an arrangement minimizes jamming of fixtures 30 stacked in magazine 10. In FIG. 7, the nominal, or average, position of recess 32a, for example of a holder 30 with respect with corresponding projection or protrusion 16a is illustrated.

Certain criteria must be satisfied by the recesses 32 and co-operating projections 16 of holder 30 and magazine 10 to assure that holders 30 stored in magazine 10 cannot be reoriented without a force being applied that substantially distorts the dimensions of the holders 30, magazine 10 or both. In FIG. 8, recess 32e and projection 16e are illustrated as being rectangular to facilitate an explanation of the stability criteria. To prevent disorientation, Applicant has discovered that it is necessary that there be at least one line 44, which is perpendicular to diagonal line 46 of holder 30, that intersects projection 16e and wall 48 of recess 32e furthest from diagonal line 46. This criteria should be satisfied by each of the recesses 32 of each holder 30 with its co-operating protrusion 16 of the magazine 10 in which the holders 30 are stored. In FIG. 8, "h" is the height of protrusion 16e, i.e, the distance protrusion 16e extends into space 78, "a" is the average or nominal gap between the side walls of the recess 32e, and the side of projection 16e, "d" is the width of a recess 32e and "c" is the width of projection 16e. Assuming that the thickness of holder 30 is substantially zero, and if the following equation is satisfied:

$$\frac{2h}{6b(d-c)} \geqq 1$$

then the orientation of holder 30 with respect to magazine 10 within which it is stored cannot be changed without distorting holder 30 or magazine 10 or both. Since each holder 30 has a finite thickness, the greater the thickness of holder 30, the more conservative is the stability criteria. While the above explanation of the stability equation, or criteria, has been given with respect to protrusion 16e and recess 32e with each having rectangular cross sectional areas, experience has revealed that this criteria is applicable to any recess 32 and protrusion 16 of substantially any cross sectional area.

FIG. 9 is a schematic view on a reduced scale, of a different arrangement of recesses 32f-h and protrusions 16f-h of holder 50 in magazine 52. Depending upon the spacing, or clearance, between the protrusion 16f-h and recesses 32f-h, three asymmetrically positioned recesses 32 and co-operating protrusion 16 can prevent a holder 50 from changing its orientation once it is stored inside magazine 52. However, in such an embodiment as is illustrated in FIG. 9, if the tolerances on the dimensions and shape of the magazines and holders are not held with a fairly high degree of accuracy, holders 50 stored in magazine 52 have a tendency to become bound up, or jammed.

FIG. 10 illustrates another embodiment of holder 54 and magazine 56 in which the cross sections of the recesses 32i, j, k, m and protrusions 16i, j, k, m are rectangular. It should be noted that the recess 32i and projection 16i are displaced to one side of the perpendicular bisector 58 of holder 54, and are therefore, asymmetrically positioned.

FIG. 11 illustrates another embodiment of the invention in which a recess 32n in holder 60 and its co-operating projection 16n of magazine 62 have co-operating triangular shaped cross sectional areas. In the embodiment of FIG. 11 only two co-operating pairs of asymmetrically located recesses 32 and protrusions 16 are needed to prevent fixture 60 stored in magazine 62 from changing its orientation and of course limiting the orientation of the holders 60 in the magazine 62 to only one of eight theoretically possible orientations or arrangements.

In the embodiment illustrated in FIGS. 12-15, magazine 70 includes a hollow substantially rectangular tube 72 which is preferably extruded from a metal such as aluminum. Protrusions 74a, b, c, and d are formed integrally with tube 72 during the process of extruding tube 72. Cross sections of protrusions 74a-d are segments of a circle of a size substantially equal to those of the protrusions 16a-d as seen in FIG. 2 and are positioned asymmetrically on the inner sides of the walls 76a-d of tube 72. Protrusions 74a-d project into the prismatic interior storage space 78 defined by the wall means 76a-d. The positions of protrusions 74a-d on the inner sides of wall 76a-d are substantially the same as protrusions 16a-d on magazine 10 as described and illustrated with respect to FIG. 6 so that the relationships between protrusions 74a-d and recesses 32a-d of a fixture or slide frame 30 as well as their functions as described with respect to magazine 10 and as illustrated in FIGS. 6, 7 and 8 are the same. Projections 74a-d satisfy the stability criteria that must be satisfied to assure that a holder 30 stored in magazine 70 cannot be reoriented without a force being applied that substantially distorts the dimensions of holders 30, magazine 70 or both in the same way that the projections 16a-d of magazine 10 do.

Magazine 70 is not provided with a pair of legs at each end of tube 72 as is magazine 10, but rather is provided with retention means 80a-h which retain any fixture 30 placed in or loaded into storage space 78. The retention means 80 permit fixtures to be inserted into storage space and to be removed therefrom through either face 81a, b of storage space 78. The retention means are mounted in selected ones of the grooves 82a-h which are formed in the outer surfaces of wall means 76a-d preferably at the time tube 72 is extruded. The upper and lower ends of grooves 82a, b, e, f are provided with notches, or cutouts 84a-h in the grooves 82 of opposite walls such as walls 76a and 76c and at the upper and lower ends of the grooves of walls 76a and 76c.

Each of the retention means 80a-h is, in the embodiment illustrated, a spring catch 86. Details of spring catches 86b and 86f are best seen in FIGS. 13 and 15. Each catch 86 is made of spring steel and has a shank 88, a catch 90, and a cam surface 92. The shanks 88a-h are secured to the wall means 76 by pairs of rivets 94 in the embodiment illustrated in FIGS. 12-15. Either end of magazine 70 can be inserted into a mechanism for loading or inserting fixtures into storage space 78 through faces 81a, 81b of storage space 78. Face 81a which is illustrated in FIG. 13 by a dashed line, is defined by the surfaces of catch 90 of spring catch 86b, for example as seen in FIG. 13. Face 81b defind by the surfaces of catch portions 90 of the spring catches 86e f g h at the bottom end of magazine 70 as illustrated in FIG. 12. In FIG. 12, however, face 81b, and catches 86g and h are not seen. Pushing a fixture 30 against cam surfaces 92 of the spring catches 86 at one end of magazine 70 will spread apart or open the catches so that the fixture 30 can be loaded into the storage space 78. To unload fixtures 30 from the storage space, the device into which magazine 70 would be inserted would spread open the four spring catches 86 at the end of magazine 70 so inserted so that the fixtures would be free to move downwardly, by gravity, for example, or they would no longer be prevented from doing so by catches 86 so that they can pass through a face 81b, for example, of storage space 78.

The width of each side wall means of tube 12 or tube 72 is preferably 2.04 inches. The side wall means define an interior or storage space having a substantially square cross sectional area. Holders 30 are also substantially square with the length of each side being substantially 1.954 inches. This provides a total clearance of 0.086 inches and a nominal clearance between a fixture 30 and the interior wall of the wall means forming hollow tube 12 or 72 of 0.043 inches. The diameter of the protrusions 16 or 74 is 9/32 of an inch and the diameter of the recesses 32 in holder 30 is 5/16 of an inch. The center of the asymmetrically positioned protrusions 16d, or 72d and the center 38d of recess 32d are displaced 0.125" from perpendicular bisector 36 as seen in FIG. 6.

The angles 14 of the embodiment illustrated in FIGS. 1-4 are made of 18 gauge sheet steel, and rods 16 are made of steel rod. Rods 16 and angles 14 are joined or welded together by spot welding. The flanges 20 of legs 18 are also preferably spot welded to tube 12. The legs 18 are formed preferably by their being stamped from 18 gauge sheet steel.

In the embodiment of FIGS. 12-15 the magazine 70 is preferably made of extruded aluminum tubing having a nominal thickness of 0.110 inches. While magazine 10 or 70 could be made from other appropriate materials such as plastics, to minimize the cost of manufacturing, to reduce the risk of static electrical discharges occurring which could damage the I.C. chips 64 mounted on holder 30 for example, it is preferable to make the magazines of a good electrical conductor.

From the foregoing it is believed obvious that this invention provides material handling apparatus in which holders or fixtures stored within a magazine can only have a single orientation with respect to the magazine. Once the holders are stored in the improved magazine, there is no reasonable possibility of their orientation being changed with respect to the magazine irrespective of how the magazine is subsequently handled. The improved magazine also has the capability of having fixtures inserted or removed from either end of a magazine. Use of the improved material handling apparatus reduces the amount of manual handling of fixtures that must be performed in the course of testing and manufacturing complex electronic circuits using I.C. circuits mounted on flexible beam lead frames to substantially zero. This results in a more reliable, lower cost method of production of such complex circuits.

It should be obvious that various modifications can be made to the described embodiment without departing from the scope of the present invention.

What is claimed is:

1. Material handling apparatus comprising:
a magazine having substantially planar walls defining a prismatic interior storage space having a rectangular cross section, and open top and bottom faces, said magazine adapted to have stored therein a plurality of substantially rectangular laminar fixtures having four sides, each of said fixtures having means forming "n" recesses, where "n" is an integer greater than 1, in the sides of said fixture, there being no more than one recess in a given side of a fixture;
retention means mounted on said wall means for retaining in said storage space fixtures placed therein, said retention means permitting fixtures to be inserted into the storage space and to be removed therefrom through either face of the storage space;
means forming "n" protrusions, on the walls defining the storage space there being no more than one protrusion on a given wall, said protrusions being substantially parallel to each other and extending between said top and bottom faces, and each of said protrusions projecting into said space, said protrusions and recesses in the fixtures being asymmetrically and co-operatively positioned so that each protrusion projects into a corresponding recess of each fixture stored in the magazine, and so that each fixture stored in the magazine can have only one orientation with respect to the magazine and so that each fixture stored in the magazine is prevented from substantially changing its orientation with respect to the magazine irrespective of the number of fixtures stored therein and irrespective of subsequent changes in orientation of the magazine.

2. The material handling apparatus of claim 1 in which "n"=four.

3. The material handling apparatus of claim 2 in which the walls and means forming protrusions are integral.

4. The material handling apparatus of claim 3 in which the retention means are spring catches.

5. The material handling apparatus of claim 4 in which the spring catches have two states, in their first state retaining fixtures stored in the storage space and in their second state permitting fixtures to be inserted into said space or to be removed therefrom.

6. The material handling apparatus of claim 4 in which the cross section of the storage space is substantially square.

7. The material handling apparatus of claim 6 in which the protrusions and the recesses of the laminar fixtures satisfy the following equation:

$$\frac{2h}{6b\,(d-c)} \geq 1$$

where "h" equals the distance the protrusion extends into the storage space, "b" is the average distance between the height of the protrusions and the inner edge of the recess into which it fits, "d" equals the effective width of the recess, and "c" equals the effective width of the protrusion; whereby a fixture placed in the magazine with its recesses fitting around the protrusions of the magazine has one and only one orientation with respect to the magazine and the fixtures placed in the magazine are inhibited from substantially changing their orientation with respect to the magazine.

8. Material handling apparatus comprising:
a sustantially square laminar reusable fixture adapted to have a segment of film removably secured to it, each fixture having four side walls, and means forming asymmetrically positioned recesses in the side walls, one recess in each of the four walls;
a magazine having walls, each wall having a length, and legs, said walls and legs defining an interior space adapted to have a plurality of said fixture stored into said space and withdrawn from said space serially from either end thereof, protrusions formed in the walls and extending into the interior space of said magazine, said protrusions being substantially parallel to each other and extending substantially the full length of the walls of the magazine, said protrusions being asymmetrically positioned so that the recesses of each fixture slidably fit around the protrusions when a fixture having a predetermined orientation is stored in said magazine;

the protrusions of the magazine and the recesses formed in each fixture permitting only said predetermined orientation of a fixture placed in the magazine, said protrusions and recesses preventing a fixture placed in the magazine from substantially changing its orientation with respect to the magazine.

9. Material handling apparatus comprising:

a substantially rectangular laminar reusable fixture having sides, said fixture adapted to have a segment of film removably mounted on the fixture, four notches formed in the sides of the fixture, said notches being formed so that three of the notches lie on perpendicular bisectors of the sides of the fixture, the fourth notch being formed in the fourth side so that it is not on the perpendicular bisector of that side;

a magazine having a pair of bases having planar surfaces, substantially planar walls secured to said bases, four rods secured to the walls so that the rods are substantially parallel to each other and perpendicular to the planar surfaces of said bases, said rods being positioned so a fixture can be located between said rods substantially parallel to the planar surfaces of said bases with the rods slidably fitting into the notches of each fixture stored in the magazine, said rods and the notches in the fixtures satisfying the following equation:

$$\frac{2h}{6b(d-c)} \geq 1$$

where "h" equals the dimension of of the rod perpendicular to the surface of the planar walls, "b" is the average distance, or clearance, between the rod and the inner edge of a notch into which the rod fits, "d" equals the effective width of the notch and "c" equals the effective width of the rod; whereby a fixture placed in the magazine with its notches fitting around the rods of the magazine has one and only one orientation with respect to the magazine and fixtures placed in the magazine are inhibited from substantially changing their orientation with respect to the magazine.

* * * * *